(12) United States Patent
Vilas Boas et al.

(10) Patent No.: US 10,444,778 B2
(45) Date of Patent: Oct. 15, 2019

(54) VOLTAGE REGULATOR

(71) Applicant: NXP B.V., Eindhoven (NL)

(72) Inventors: Andre Luis Vilas Boas, Campinas (BR); Dale McQuirk, Round Rock, TX (US); Miten Nagda, Austin, TX (US); Richard Titov Lara Saez, Campinas (BR)

(73) Assignee: NXP USA, Inc., Austin, TX (US)

( * ) Notice: Subject to any disclaimer, the term of this patent is extended or adjusted under 35 U.S.C. 154(b) by 242 days.

(21) Appl. No.: 15/232,373

(22) Filed: Aug. 9, 2016

(65) Prior Publication Data

US 2018/0046211 A1 Feb. 15, 2018

(51) Int. Cl.
*G05F 1/10* (2006.01)
*G05F 1/575* (2006.01)
*G11C 5/14* (2006.01)

(52) U.S. Cl.
CPC .............. *G05F 1/575* (2013.01); *G11C 5/147* (2013.01)

(58) Field of Classification Search
CPC ........... H02M 3/156; H02J 7/35; G05F 1/575; H01L 2924/00; H01L 2924/00014; H01L 2924/16225; H01L 2924/32225; H01L 2924/73204
See application file for complete search history.

(56) References Cited

U.S. PATENT DOCUMENTS

| 5,041,741 A * | 8/1991 | Steele | H03K 19/00361 326/33 |
| 5,391,936 A * | 2/1995 | Soh | G11C 27/026 327/403 |
| 5,744,944 A * | 4/1998 | Danstrom | G05F 1/565 323/274 |
| 7,208,919 B2 | 4/2007 | May | |
| 7,372,382 B2 | 5/2008 | Hazucha et al. | |
| 2009/0212753 A1 | 8/2009 | Lou | |
| 2010/0060083 A1 | 3/2010 | Rolland | |
| 2011/0043043 A1* | 2/2011 | Anupindi | H01M 10/425 307/66 |
| 2014/0062559 A1* | 3/2014 | Gonzalez | H03K 5/1565 327/175 |
| 2014/0140146 A1* | 5/2014 | Mozak | G05F 1/10 365/189.07 |
| 2014/0028516 A1 | 9/2014 | Wang et al. | |
| 2014/0285165 A1 | 9/2014 | Wang et al. | |
| 2015/0356226 A1* | 12/2015 | Yang | G06F 17/5072 716/120 |
| 2015/0378379 A1 | 12/2015 | Bhattad et al. | |

FOREIGN PATENT DOCUMENTS

TW       M386518 U       8/2010

* cited by examiner

*Primary Examiner* — Sibin Chen

(57) ABSTRACT

A voltage regulator circuit that regulates voltage on an output node that provides power to a load circuit having varying current draw. A feedback voltage from the output node is compared to reference voltages. In response to the comparisons, pull-up/down circuits are applied to a gate-control node connected to the gate of a pass transistor. The voltage of the gate-control node is adjusted by integrating current from the pull-up/down circuits. In response to the feedback voltage being between the first and second reference voltages, the voltage on the gate-control node is maintained by disabling the pull-up/down circuits at the gate-control node.

21 Claims, 4 Drawing Sheets

VOLTAGE REGULATOR

OVERVIEW

Aspects of various embodiments are directed to voltage regulator circuitry.

Voltage regulator circuits generate a constant output voltage from a voltage supply. There are many different types of voltage regulator circuits, each having different characteristics and advantages. Some voltage regulator circuits use a negative feedback loop that allows for the regulator to adjust its operating parameters in response to changes in the load, voltage supply, or other factors. A particular type of voltage regulator that uses negative feedback is a low-dropout (LDO) regulator. LDO regulators use one or more pass transistors to control the flow of current from the voltage supply to the output of the regulator circuit.

These and other matters have presented challenges to efficiencies of voltage regulator circuit implementations, for a variety of applications.

SUMMARY

Various example embodiments are directed to issues such as those addressed above and/or others which may become apparent from the following disclosure concerning voltage regulators using pass transistors.

In certain example embodiments, aspects of the present disclosure involve LDO regulators that provide efficiencies through the use of a dead band region that consumes little power.

Consistent with various embodiments, an apparatus includes a voltage regulator circuit configured to regulate voltage on an output node that provides power to a load circuit having varying current draw. The voltage regulator circuit includes: a gate-control node, wherein there is no direct current path between the output node and the gate-control node; an output transistor including a gate connected to the gate-control node, the output transistor configured to: integrate current applied to the gate-control node to produce a voltage on the gate-control node; and adjust an amount of an output current provided to the output node in response to the voltage on the gate-control node. A comparator circuitry is configured to: compare a feedback voltage on the output node to a first reference voltage and a second reference voltage; decrease the voltage on the gate-control node by applying, in response to the feedback voltage being smaller than the first reference voltage, a pull-down circuit to the gate-control node; increase the voltage on the gate-control node by applying, in response to the feedback voltage being greater than the second reference voltage, a pull-up circuit to the gate-control node; and maintain the voltage on the gate-control node by disabling, in response to the feedback voltage being between the first and second reference voltages, the pull-up and pull-down circuits at the gate-control node.

According to certain embodiments, a method is provided for use with a voltage regulator circuit that regulates voltage on an output node that provides power to a load circuit having varying current draw. The method comprises: comparing a feedback voltage from the output node to a first reference voltage; comparing the feedback voltage to a second reference voltage; applying, in response to the comparisons, a pull-up circuit to a gate-control node connected to a gate of a pass transistor; applying, in response to the comparisons, a pull-down circuit to the gate-control node; adjusting the voltage of the gate-control node by integrating current from the pull-up and pull-down circuits; and maintaining, in response to the feedback voltage being between the first and second reference voltages, the voltage on the gate-control node by disabling the pull-up and pull-down circuits at the gate-control node.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

Figure 1:
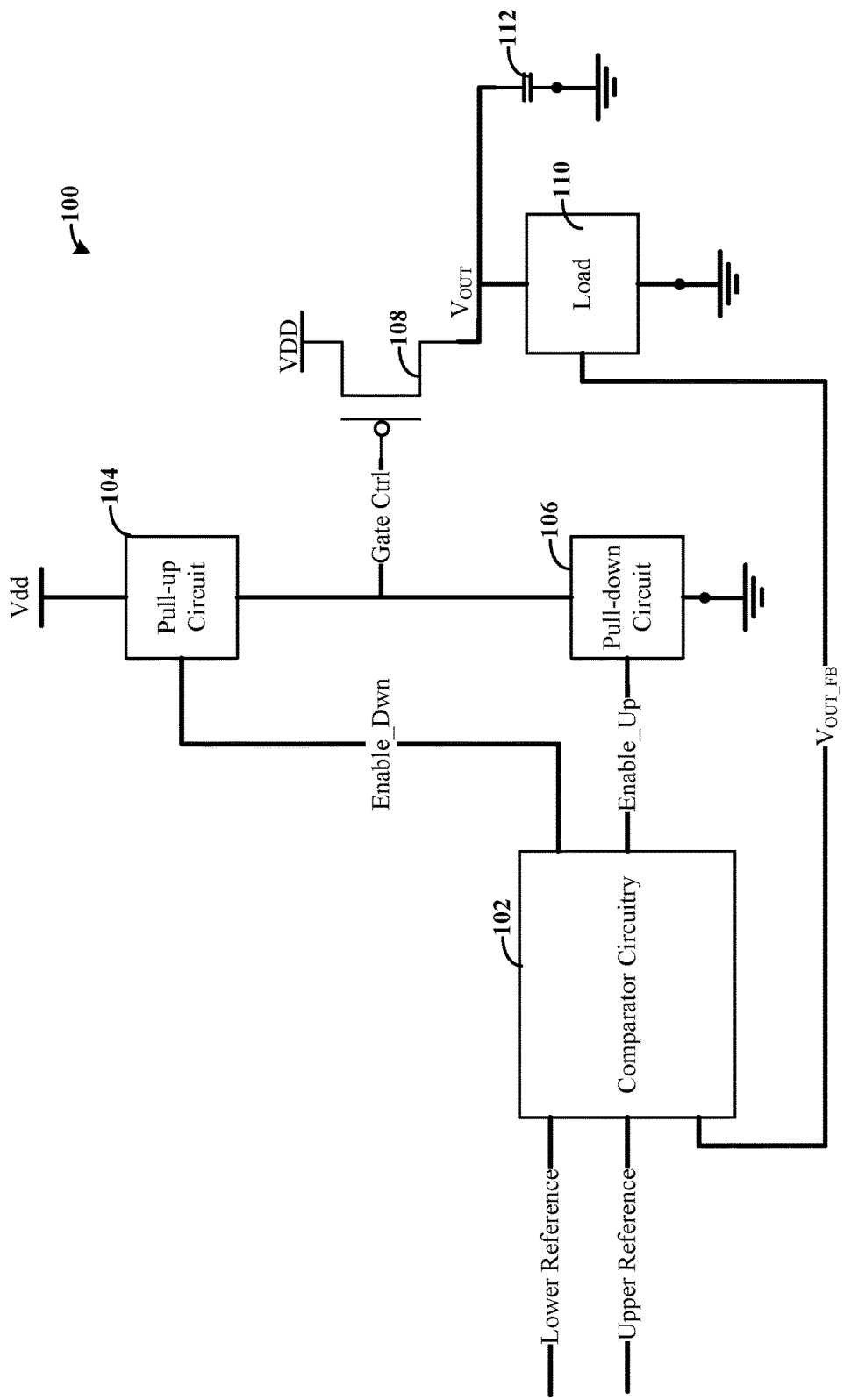
FIG. 1 is a block diagram of a system that includes a voltage regulator circuit, consistent with embodiments of the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving voltage regulator circuitry. In certain implementations, aspects of the present disclosure have been shown to be beneficial when used in the context of voltage regulation with large swings in current draw, as might occur with respect to different microprocessor modes. In some embodiments, the voltage regulator circuitry is configured with a dead band zone within which the feedback loop is not actively adjusting the output. While not necessarily so limited, various aspects may be appreciated through the following discussion of non-limiting examples which use exemplary contexts.

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

Various embodiments of the present disclosure are directed toward a voltage regulator circuit that provides a tunable delay line relative to the rate of current change over time (di/dt). In particular implementations, the voltage regulator circuit is a low-dropout (LDO) regulator that uses a field-effect transistor (FET) as an output transistor (or a 'pass gate') that controls the amount of current provided to the output load. A gate-control node is connected to the gate of the FET and the voltage regulator circuit adjusts the provided current by changing the voltage on a gate-control node.

Consistent with embodiments of the present disclosure, the voltage regulator circuit adjusts the voltage on the gate-control node by selectively applying pull-up/down circuits (e.g., current sources) that add or remove charge from the gate-control node. The selective application can be responsive to respective voltage thresholds for the output voltage. The voltage regulator circuit can also be designed to cease adjustment of the gate-control node voltage when the output voltage is within a dead band region. The dead band region can correspond to the output voltage being between the voltage thresholds.

Various embodiments of the present disclosure are directed toward a voltage regulator circuit that has a feedback loop that includes at least two comparators that are designed to directly compare the output voltage to respective reference voltages. The comparators are configured to provide binary control over respective pull-up/down circuits. The pull-up/down circuit increase or decrease voltage at gate-control node that controls how strongly the pass transistor is driven. In this manner, the feedback loop does not rely upon a voltage divider network and also functions with a dead band region where neither the pull-up circuit nor the pull-down circuit is actively driving the gate-control node.

According to certain embodiments, the voltage regulator circuit is configured to allow the gate-control node to 'float' while in the dead band region. In particular, the gate-control node can be electrically isolated so that charge stored at the node is conserved. This can be accomplished by disabling the pull-up/down circuits relative to the gate-control node (e.g., using a set of switches). Accordingly, the voltage regulator circuit consumes reduced amount of current while in the dead band region.

According to various embodiments, the gain of the feedback loop for the voltage regulator circuit is substantially constant over a wide range of load conditions (even at virtually no load). For instance, the feedback loop gain can be substantially independent of the output FET transistor characteristics at different output load conditions. This can be accomplished, for instance, using two comparators to control the application and of current sources to the gate-control node. The comparators can compare the output voltage to respective voltage thresholds and then apply or disabled the current sources accordingly.

Particular implementations of the present disclosure are directed toward a voltage regulator circuit that provides stability over a wide range of load conditions and without the use of a stabilization output current at the output node. It is recognized that the feedback loop of an LDO may have gain and phase characteristics that are dependent upon the output load impedance. Accordingly, LDO regulators designed to provide a relatively high current draw can have issues stabilizing at a relatively low current draw due to poles introduced by the output elements and parasitic capacitance of other components, such as the pass transistor. While, additional circuitry can be included to provide a background current that helps stabilize the LDO regulator at low current draw (e.g., a current source attached to the output load), the additional current can increase the current draw of the LDO, which can be undesirable in some systems (e.g., battery operated devices that operate in low power modes).

Turning now to the figures, FIG. 1 is a block diagram of a system that includes a voltage regulator circuit, consistent with embodiments of the present disclosure. The system 100 includes a voltage regulator circuit that is configured to provide an output voltage (Vout) to a load 110. The voltage regulator circuit can be configured to operate as an LDO regulator that uses a pass transistor 108. According to embodiments of the present disclosure, the pass transistor 108 is a PMOS transistor. The use of a PMOS transistor in the depicted configuration can be particularly useful for implementations that do not rely upon a charge pump to generate a control signal for the gate of the pass transistor. While a single PMOS transistor 108 is depicted, the LDO regulator is not necessarily so limited.

The voltage regulator circuit includes comparator circuitry 102 that forms part of a feedback loop. The comparator circuitry 102 is configured to compare a feedback voltage ($V_{OUT\_FB}$) with two different reference voltages ("lower reference" and "upper reference"). The comparator circuit 102 uses the results of the comparisons to drive signals (Enable_Dwn, Enable_Up) that selectively turn on one of pull-up/down circuits 104 and 106 to the gate-control node ("gate ctrl"). The gate-control node is then used to drive the gate of the transistor 108 in order to adjust the amount of current that is provided at the output node ($V_{OUT}$).

According to certain embodiments of the present disclosure, the comparator circuitry 102 enables and disables the pull-up/down circuits 104 and 106 depending upon whether the $V_{OUT}$ is above or below the corresponding reference voltage. In particular, the comparator enables the pull-down circuit 106 when $V_{OUT}$ is below the lower (low) reference voltage and disables the pull-down circuit 106 when $V_{OUT}$ is above the lower reference voltage. The comparator also enables the pull-up circuit 104 when $V_{OUT}$ is above the upper (high) reference voltage and disables the pull-up circuit 104 when $V_{OUT}$ is below the upper reference voltage. When $V_{OUT}$ is between the lower reference voltage and the upper reference voltage, the comparator disables both pull-up/down circuits 104, 106. Accordingly, the comparator circuitry operates in a binary fashion for the output control signals that enable (apply) and disable the pull-up/down circuits 104, 106.

According to certain embodiments, the current from the pull-up/down circuits 104, 106 can be integrated in a capacitance present on the gate-control node. In particular, the integration can be generalized from the formula $i=C\,dv/dt$, where C is the capacitance of the gate-control node and i is the applied current over time. The voltage on the gate-control node represents an integration of the current (as a function of the capacitance C). In some instances, the majority of the capacitance is due to the parasitic or intrinsic aspects of the circuit. In particular, the majority of the capacitance can be from the gate-source capacitance (CGs) of the transistor 108, with only a small contribution from other parasitic or intrinsic aspects of the circuit. In other instances, a specific capacitive circuit can be connected to the gate-control node, such as by creating a dedicated capacitor within the integrated circuit (IC) die of the voltage regulator circuitry.

Consistent with various embodiments, the pull-up circuit 104 is configured to increase the voltage on the gate-control by adding charge to the capacitance of the gate-control node. Conversely, the pull-down circuit 106 is configured to decrease the voltage on the gate-control node by discharging charge stored in the capacitance of the gate-control node. When neither pull-up/down circuits are being applied, the gate-control node is effectively floating. This condition is referred to as the dead band region because the gate-control node is not being actively adjusted based upon the feedback voltage. Rather, the voltage level is maintained until one of the pull-up/down structures is activated (not accounting for minor effects from leakage currents).

Consistent with certain embodiments, the load 110 is a circuit that operates in at least two modes with significantly different current draw. For instance, the load could include a microprocessor circuit that includes one or more of a high power mode, a low power mode, and a sleep mode with almost no current draw. The regulator circuitry is configured to maintain a stable voltage over the loads of such modes. Moreover, the regulator circuitry provides a fast response that allows for quick switching between the modes and their corresponding current draw without significant overshooting or undershooting of the output voltage.

It has been recognized that the regulated voltage provided to load circuitry 110 can exhibit a voltage drop due to the intrinsic impedance of the voltage distribution circuit of load circuitry. Consistent with certain embodiments, the feedback voltage ($V_{OUT\_FB}$) is taken from a particular location within the load circuitry 110 so that the voltage regulator circuitry can compensate for the voltage drop. For example, the load might be a programmable logic circuit of relatively large size and correspondingly long power distribution routing (e.g., a Sea-of-Gates routing architecture). The feedback voltage can be taken from a point at, or near, the expected worse case voltage drop within the programmable logic circuit (or other types of circuitry).

According to particular embodiments, the voltage regulator circuit can be configured to use a decoupling capacitor 112. The decoupling capacitor 112 functions as a low pass filter by compensating changes in current draw that are faster than the rate at which voltage regulator circuitry feedback loop operates. This includes providing charge when the output voltage drops, and storing charge when the output voltage increases.

Consistent with various embodiments, the decoupling capacitor is external to the IC package that includes the voltage regulator circuitry. For example, the voltage regulator circuit can be part of system-on-chip (SOC) with one or more IC dies within a common package that is designed to be placed on a printed circuit board (PCB) or similar structure. The SOC can be designed with the capability of using a regulated voltage ($V_{OUT}$) provided from either an external voltage regulator or the internal voltage regulator circuitry (which would be disabled when an external regulator is being used). To accommodate the ability to provide an externally regulated voltage, the SOC includes a pin that connects to the $V_{OUT}$ supply node. This pin can also be used for a dual purpose of providing an externally regulated voltage and connecting to a decoupling capacitor, which can be placed on the same circuit board as the SOC.

In particular embodiments of the present disclosure, the voltage regulator provides voltage regulation on the order of about 1.0 V, 0.6V, or potentially even lower. Moreover, the voltage regulator can provide this regulation at current draw levels that differ by several orders of magnitude. For example, the load may operate in a low power mode with virtually no current draw (e.g., a few nA) and in a higher power mode with current draw exceeding several mA. It is further recognized that the range of acceptable voltages can be smaller as the voltage level is reduced. For instance, a microprocessor (or memory) circuit that operates at 1.8 V might allow for a drop of 100 mV, while such a deviation would not be acceptable for a microprocessor circuit that operates at 1.0 V or lower.

Figure 2:
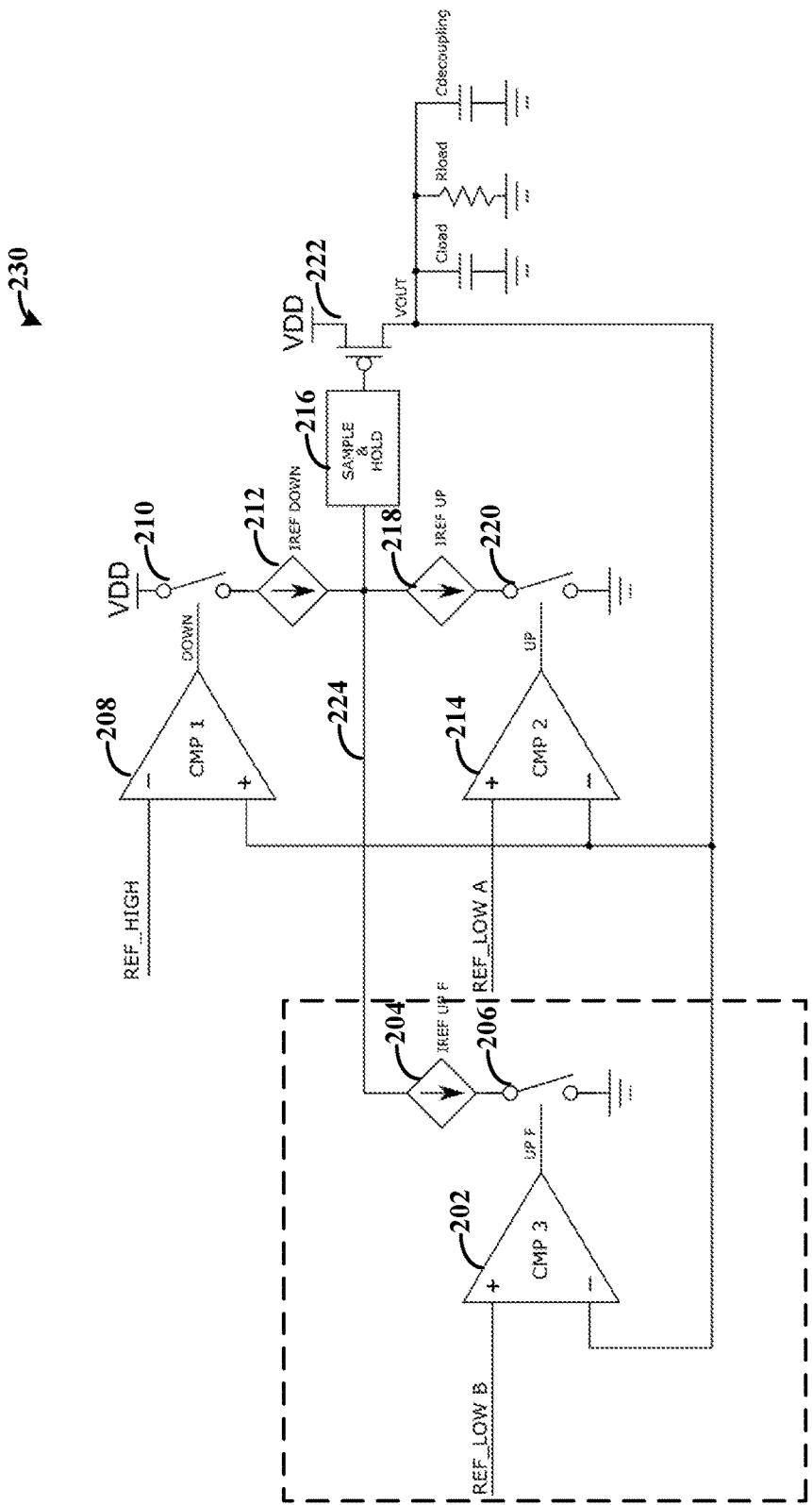
FIG. 2 shows a circuit diagram of a system that includes a voltage regulator circuit, consistent with embodiments of the present disclosure.

FIG. 2 shows a circuit diagram of a system that includes a voltage regulator circuit, consistent with embodiments of the present disclosure. The system 230 includes an output (pass) transistor, metal-oxide-semiconductor field-effect transistor (MOSFET) 222, which provides current to the output of the voltage regulator circuit. The amount of current provided will increase or decrease depending upon the voltage on the gate of the pass transistor 222, which is set by the sample and hold circuitry 216. The sample and hold circuit 216 is configured to integrate the current on gate-control node 224 to produce a voltage that is then provided to the gate of the pass transistor 222. According to various embodiments, the sample and hold circuitry 216 can be omitted and voltage on the gate-control node 224 can be directly applied to the gate of the pass transistor 222.

Consistent with various embodiments, comparators 208 and 214 are configured to control which, if any, of the current sources 212 and 218 are applied to the node 224. In particular, comparator 214 applies current source 218 when the output voltage ($V_{OUT}$) is below the REF_LOW A voltage. Comparator 208 applies current source 212 when the output voltage is above REF_HIGH. The reference voltages can be generated using various different circuits, such as by using one or more bandgap voltage reference circuits. According to various embodiments, a set of switches 210 and 220 can be used to apply and disable the current sources 212 and 218 by way of respective control signals ("down" and "up").

In certain embodiments, one or more additional comparators can be used to change the effective gain of the feedback loop. For instance, comparator 202 can compare the feedback voltage to reference voltage REF_LOW B, which is lower than REF_LOW A. When the feedback voltage goes below REF_LOW B, comparator 202 enables switch 206, which applies the current source 204 to the node 224. The additional current results in a faster voltage change on the node (dv/dt) and can be used to increase the rate of output current change (di/dt). This can also be useful for more quickly raising the voltage level upon startup or after a power down (reset) event. Additional levels of comparators and current sources can be implemented in a similar manner.

According to some embodiments, the relative strengths of the current sources 212 and 218 can be set to the magnitude of current. This would result in the same rate of change for the voltage on the gate-control node for each corresponding state ("down" or "up"). Various embodiments also allow for the current sources 212, 218 to have different magnitude for their respective currents. For instance, the current magnitude of current source 212 could be set higher than that of current source 218 so that the pass transistor is turned OFF faster than it is turned ON. When considering the possible addition of more current sources, such as current source 204, there are any number of different possible combinations of current magnitude settings for various different applications.

Figure 3:
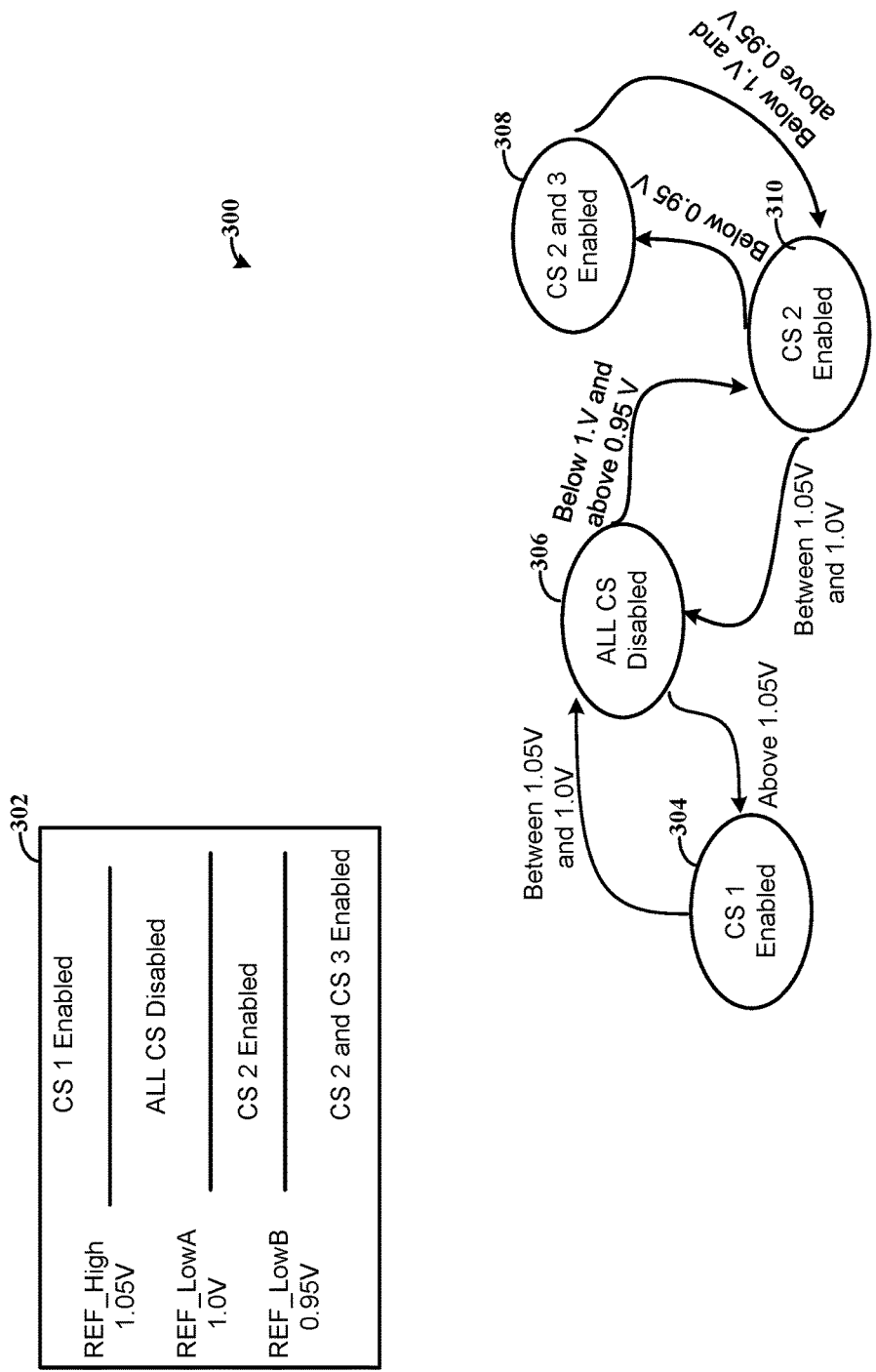
FIG. 3 is a state diagram for the operation of the comparators depicted in FIG. 2, consistent with embodiments of the present disclosure.

FIG. 3 is a state diagram for the operation of the comparators depicted in FIG. 2, consistent with embodiments of the present disclosure. The state diagram 300 corresponds to the levels shown in box 302 and indicates when the corresponding current sources (CS) are applied to the gate-control node, where CS1=212, CS2=218, and CS3=204. In the particular example shown in FIG. 3, the voltage regulator circuit is configured to use three different reference voltages for the comparators of the corresponding current sources, where CS1=1.05V, CS2=1.0V, and CS3=0.95V.

In state 304, the voltage is above the high reference voltage of 1.05. This causes CS1 to be applied, which results in an increase of the voltage on the control-gate node and causes the pass transistor to provide less current. The output current will continue to decrease, which will result in the output voltage dropping. Once the voltage drops below 1.05V, the voltage regulator circuitry enters state 306 where all of the current sources are disabled. The gate-control node will maintain the current voltage level while in this stage. If the voltage drops below 1.0V, then the voltage regulator circuitry enters state 310, where CS2 is applied to the gate-control node. The application of CS2 results in a decrease of the voltage at the gate-control node, which causes a corresponding increase in the output current. If the increase is not sufficiently fast, then the output voltage might drop below 0.95V. In embodiments where a third comparator is used, this results in the voltage regulator circuitry entering state 308, where CS3 is applied to the gate-control node. This causes the voltage at the gate-control node to decrease at a faster rate than in state 310.

Figure 4:
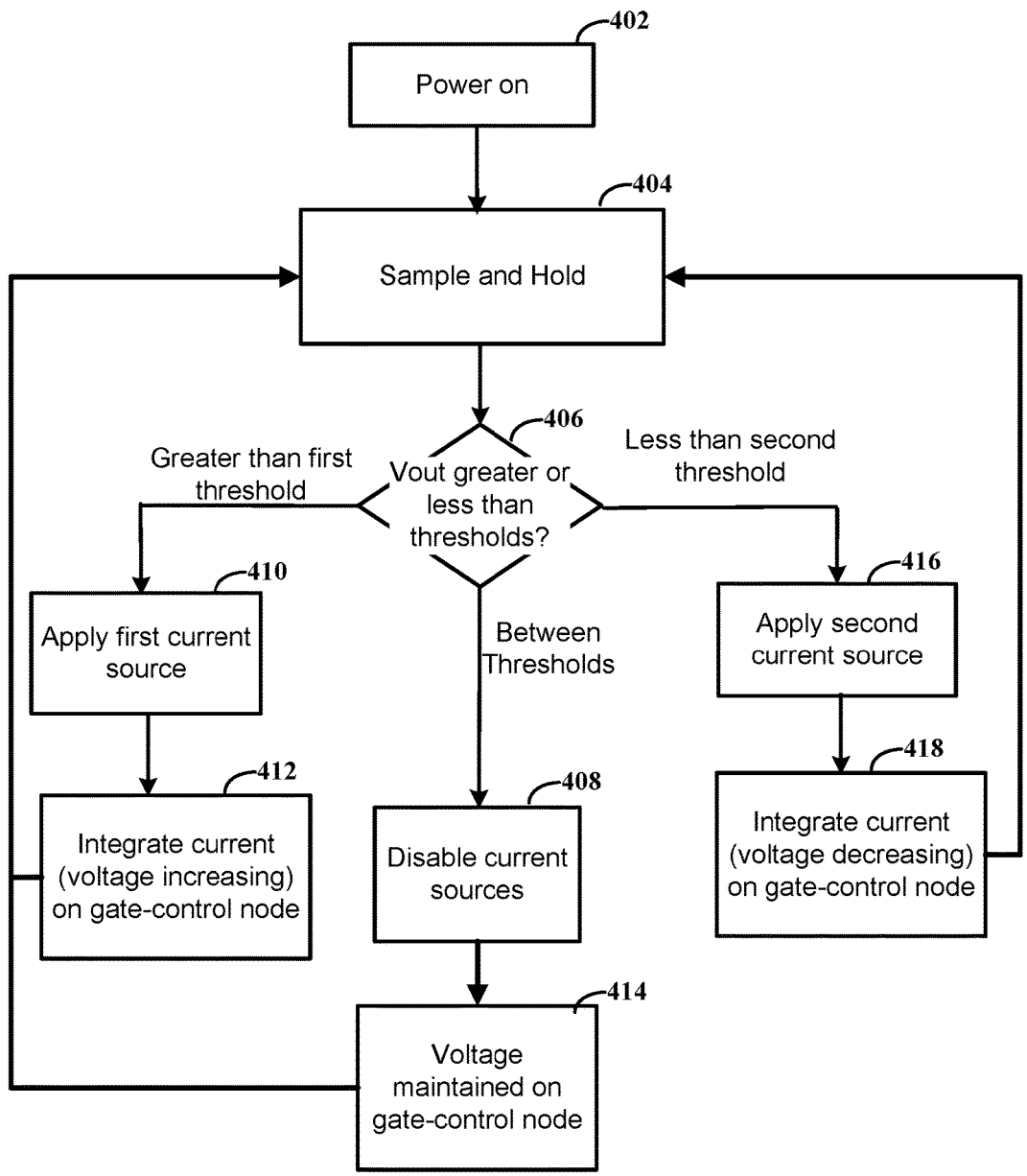
FIG. 4 depicts a flow diagram for use with a voltage regulator circuit, consistent with embodiments of the present disclosure.

FIG. 4 depicts a flow diagram for use with a voltage regulator circuit, consistent with embodiments of the present disclosure. The flow diagram beings when a power on event occurs, per block 402. The power on event corresponds to the beginning of regulation by the voltage regulator circuit. For instance, the power on event might correspond to main power (Vdd) first being provided or to a power-on reset (or similar) signal. At node 404, a sample and hold circuit can sample the voltage on the gate-control node and provide the sampled voltage to the gate of the pass transistor. It is noted that the sample and hold circuit can introduce an additional delay in the feedback loop, and such delay may not be desired. The sample and hold period can therefore be set relatively small or the sample and hold circuit can be left out completely.

The comparators can continually compare the output voltage ($V_{OUT}$) to the threshold voltages, per block 406. When the voltage is greater than a first (high) threshold, a first current source can be enabled per block 410. The first current source provides charge to the gate-control node. The current is integrated by the capacitance at the node, causing the voltage on the gate-control node to increase, per block 412. The result of the increased voltage is to reduce the output voltage as well as the current through the pass (PMOS) transistor.

When the voltage is between the thresholds, the comparators disable the current sources, per block 408. This effectively isolates the gate-control node causing the output voltage to be maintained (assuming a static current draw), per block 414. Depending upon the prior state, the maintained voltage may represent the pass transistor being effectively ON (lower threshold previously crossed) or OFF (upper threshold previously crossed). The voltage regulator will maintain this state for the pass transistor causing the output voltage to continue to change in the same manner (either increase or decrease) until the other threshold is crossed. This results in a voltage ripple that corresponds to the dead band between the thresholds.

In certain instances, the output current provided by the pass transistor will match, or be very close to, the current drawn by the load. The output voltage will therefore change very little over time, allowing the voltage regulator circuit to remain in this state. As none of the current sources are active, the current draw of the voltage regulator circuit is very low in this state, and the resulting power savings can be particularly beneficial for low power applications and their low power modes. The regulator operational parameters can be set to take advantage of this condition. In particular, the regulator's transfer function (and respective pole(s) and zero(es)) can be set according to an expected load profile in order to increase the time that the regulator circuit is within the dead band, particularly for low power modes.

When the voltage is less than the second (lower) threshold, the second current source is applied to the gate-control node, per block 416. The second current source removes charge stored on the gate-control node. The current is integrated by the capacitance at the node, causing the gate voltage to decrease (and the output voltage to increase), per block 418.

Terms to that indicate orientation, such as upper/lower, left/right, top/bottom and above/below, may be used herein to refer to relative positions of elements as shown in the figures. It should be understood that when the terminology is used for notational convenience, the disclosed structures may be oriented different from the orientation shown in the figures.

For the purposes of this document, the following terms and definitions apply: "low drop out (LDO) regulator" is a regulator that uses at least one pass transistor in a manner that allows the output voltage to be regulated at a voltage that is relatively close to the supply voltage; a "current source" is an electronic circuit that delivers or absorbs an amount of current that is substantially independent of the voltage across the circuit;

The Specification describes and/or illustrates aspects useful for implementing the claimed invention(s) by way of various circuits or circuitry, which may be discussed using terms such as blocks, modules, device, system, unit, controller, comparator, and other circuit-type depictions. Such circuits or circuitry are discussed in connection other elements to how certain embodiments may be carried out. For example, in certain of the above-discussed embodiments, one or more illustrated items in this context represent circuits (e.g., discrete analog or logic circuitry or (semi-)programmable circuits) configured and arranged for implementing disclosed operations/activities, as may be carried out in the approaches shown in the figures.

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. Such modifications do not depart from the true spirit and scope of various aspects of the disclosure, including aspects set forth in the claims.

What is claimed is:
1. An apparatus comprising:
   voltage regulator circuit configured to regulate voltage on an output node that provides power to a load circuit having varying current draw, the voltage regulator circuit including:

a gate-control node, wherein there is no direct current path between the output node and the gate-control node;

an output transistor including a gate connected to the gate-control node, the output transistor configured to:

integrate current applied to the gate-control node to produce a voltage on the gate-control node; and adjust an amount of an output current provided to the output node in response to the voltage on the gate-control node; and comparator circuitry configured to:

compare a feedback voltage on the output node to a first reference voltage and a second reference voltage;

increase the voltage on the gate-control node by applying, in response to the feedback voltage being greater than the first reference voltage, a pull-down circuit to the gate-control node;

decrease the voltage on the gate-control node by applying, in response to the feedback voltage being less than the second reference voltage, a pull-up circuit to the gate-control node; and maintain the voltage on the gate-control node by disabling, in response to the feedback voltage being between the first and second reference voltages, the pull-up and pull-down circuits at the gate-control node, wherein the gate-control node is electrically isolated in response to the disablement of the pull-up and pull-down circuits.

2. The apparatus of claim 1, wherein the output transistor has a gate-source capacitance and is configured to integrate current at the gate-control node by storing applied current in the gate-source capacitance, and wherein the gate-control node is configured and arranged to conserve a charge stored at the gate-control node in response to the disablement of the pull-up and pull-down circuits, wherein the gate of the output transistor is floating in response to the disablement.

3. The apparatus of claim 1, further including a microprocessor circuit connected to and powered by the output node, wherein the microprocessor circuit has two modes of operation with orders of magnitude in difference in respective power draw.

4. The apparatus of claim 3, wherein the voltage regulator circuit is a low-dropout regulator and is further configured to regulate the voltage at the output node at voltages of 1.0 V or less and for load currents of a few nA and several mA.

5. The apparatus of claim 1, wherein the voltage regulator circuit further includes sample and hold circuitry configured to sample the voltage on the gate-control node and to hold the sampled voltage on a node that drives the gate of the output transistor.

6. The apparatus of claim 1, wherein the comparator circuitry is further configured to cause the output transistor to adjust an amount of output current at the output node by:

enabling, in response to the feedback voltage being greater than the first reference voltage, a switch that provides a current path for current for the pull-up circuit; and enabling, in response to the feedback voltage being less than the second reference voltage, a switch that provides a current path for the pull-down circuit; and wherein the pull-up and pull-down circuits correspond to respective current sources and a voltage level on the gate-control node is maintained until at least one of the pull-up and pull-down circuits is activated.

7. The apparatus of claim 1, wherein the apparatus further includes:

an integrated circuit (IC) package that includes the voltage regulator circuity; and a decoupling capacitor that is connected to the IC package through an external pin of the IC package and is configured to filter voltage transients on the output node.

8. The apparatus of claim 1, wherein the comparator circuitry is further configured to:

compare the feedback voltage to a third reference voltage; and decrease the voltage on the gate-control node by applying a second pull-down circuit in response to the feedback voltage being less than the third reference voltage.

9. A method for use with a voltage regulator circuit that regulates voltage on an output node that provides power to a load circuit having varying current draw, the method comprising:

comparing a feedback voltage from the output node to a first reference voltage;

comparing the feedback voltage to a second reference voltage;

applying, in response to the comparisons, a pull-up circuit to a gate-control node connected to a gate of a pass transistor;

applying, in response to the comparisons, a pull-down circuit to the gate-control node;

adjusting the voltage of the gate-control node by integrating current from the pull-up and pull-down circuits; and maintaining, in response to the feedback voltage being between the first and second reference voltages, the voltage on the gate-control node by disabling the pull-up and pull-down circuits at the gate-control node, wherein the gate-control node is electrically isolated in response to the disablement of the pull-up and pull-down circuits.

10. The method of claim 9, further comprising:

enabling, in response to the feedback voltage being greater than the first reference voltage, a first switch that connects a first current source to the gate-control node; and enabling, in response to the feedback voltage being less than the second reference voltage, a second switch that connects a second current source to the gate-control node.

11. The method of claim 9, further comprising:

comparing the feedback voltage on the output node to a third reference voltage; and decreasing, in response to the feedback voltage being less than the third reference voltage, the voltage on the gate-control node by applying both the pull-down circuit and an additional pull-down circuit to the gate-control node.

12. The method of claim 9, wherein the integrating current includes storing applied current in a gate-source capacitance.

13. The method of claim 9, further including powering a microprocessor circuit from the output node and operating the microprocessor circuit in two modes of operation with orders of magnitude in difference in respective power draw.

14. The method of claim 13, wherein the voltage regulator circuit is a low-dropout regulator and is further comprising regulating the voltage at the output node at a voltage of 1.0 V or less and across load currents of a few nA and several mA.

15. The method of claim 9, further comprising sampling the voltage on the gate-control node and holding the sampled voltage on a node that drives the gate of the pass transistor.

16. The method of claim 9, further comprising:
enabling, in response to the feedback voltage being greater than the first reference voltage, a switch that provides a current path for current for a first current source; and
enabling, in response to the feedback voltage being less than the second reference voltage, a switch that provides a current path for a second current source.

17. The method of claim 9, further comprising:
filtering voltage transients on the output node using a decoupling capacitor that is connected to the output node through an external pin of IC package for the voltage regulator circuit.

18. The method of claim 9, further comprising:
comparing the feedback voltage to a third reference voltage; and
decreasing the voltage on the gate-control node by applying an additional pull-down circuit in response to the feedback voltage being less than the third reference voltage.

19. The method of claim 9, further including:
comparing the feedback voltage on the output node to a third reference voltage; and
adjusting the voltage of the gate-control node by integrating current from the pull-up and pull-down circuits based on the comparison of the feedback voltage to the first, second, and third reference voltages.

20. The method of claim 9, wherein adjusting the voltage of the gate-control node by integrating current from the pull-up and pull-down circuits includes regulating voltage provided to the output node that provides power to the load circuit by selectively switching the pass transistor between two states.

21. An apparatus comprising:
voltage regulator circuit configured to regulate voltage on an output node that provides power to a load circuit having varying current draw, the voltage regulator circuit including:
a gate-control node;
an output transistor including a gate connected to the gate-control node, the output transistor configured to:
integrate current applied to the gate-control node to produce a voltage on the gate-control node; and
adjust an amount of an output current provided to the output node in response to the voltage on the gate-control node; and
comparator circuitry configured to:
compare a feedback voltage on the output node to a first reference voltage and a second reference voltage;
changing in one direction of polarity the voltage on the gate-control node by applying, in response to the feedback voltage being greater than the first reference voltage, a pull-down circuit to the gate-control node;
changing in the other direction of polarity the voltage on the gate-control node by applying, in response to the feedback voltage being less than the second reference voltage, a pull-up circuit to the gate-control node, wherein the directions of polarity are positive and negative for respectively increasing and decreasing the voltage on the gate control node; and
wherein the gate control node is electrically isolated from the output node to facilitate storage of a charge on the gate control node by maintaining the voltage on the gate-control node with, in response to the feedback voltage being between the first and second reference voltages, the pull-up and pull-down circuits being disabled, the gate-control node being electrically isolated in response to the disablement of the pull-up and pull-down circuits.

\* \* \* \* \*